United States Patent
Choi

(10) Patent No.: US 8,422,280 B2
(45) Date of Patent: Apr. 16, 2013

(54) STABLE CURRENT SUPPLY CIRCUIT IRRESPECTIVE OF PVT VARIATIONS AND SEMICONDUCTOR HAVING SAME

(75) Inventor: Young Don Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 330 days.

(21) Appl. No.: 12/780,975

(22) Filed: May 17, 2010

(65) Prior Publication Data

US 2010/0309715 A1 Dec. 9, 2010

(30) Foreign Application Priority Data

Jun. 9, 2009 (KR) .................. 10-2009-0051166

(51) Int. Cl.
*G11C 11/00* (2006.01)
(52) U.S. Cl. .................. 365/163; 365/148; 977/754
(58) Field of Classification Search ............ 365/46, 365/94, 100, 113, 129, 148, 158, 163; 257/2–5, 257/9, 296, 310, E21.35, E31.047, E27.006; 438/29, 95, 96, 166, 135, 240, 259, 365, 438/482, 486, 597, 785; 977/754
See application file for complete search history.

(56) References Cited

U.S. PATENT DOCUMENTS

| | | | | |
|---|---|---|---|---|
| 4,602,208 A * | 7/1986 | Hines | ............................. | 323/317 |
| 5,723,915 A * | 3/1998 | Maher et al. | .................. | 307/131 |
| 5,990,727 A * | 11/1999 | Kimura | ......................... | 327/513 |
| 7,286,394 B2 * | 10/2007 | Ooishi | ......................... | 365/158 |
| 7,576,598 B2 * | 8/2009 | Marinca | ........................ | 327/539 |
| 2004/0151023 A1 * | 8/2004 | Khouri et al. | ................. | 365/163 |
| 2006/0077737 A1 * | 4/2006 | Ooishi | ......................... | 365/203 |
| 2007/0030049 A1 * | 2/2007 | Yoshikawa | .................... | 327/512 |
| 2008/0001654 A1 * | 1/2008 | Byeon | ........................... | 327/541 |
| 2008/0074172 A1 * | 3/2008 | Marinca | ........................ | 327/539 |
| 2008/0088338 A1 * | 4/2008 | Kim | ............................... | 326/30 |
| 2008/0144415 A1 * | 6/2008 | Macerola et al. | ............. | 365/211 |
| 2008/0219046 A1 | 9/2008 | Chen et al. | | |
| 2009/0080267 A1 | 3/2009 | Bedeschi et al. | | |
| 2009/0080276 A1 * | 3/2009 | Cai et al. | ....................... | 365/212 |

FOREIGN PATENT DOCUMENTS

WO 2008150693 A1 12/2008

* cited by examiner

*Primary Examiner* — Harry W Byrne
(74) *Attorney, Agent, or Firm* — Volentine & Whitt, PLLC

(57) ABSTRACT

A current supply circuit comprises a reference voltage generator generating a reference voltage that varies with temperature, a current circuit generating a constant reference current irrespective of the temperature based on the reference voltage, and a current source generating a mirror current by mirroring a base current as a replica current of the reference current.

18 Claims, 9 Drawing Sheets

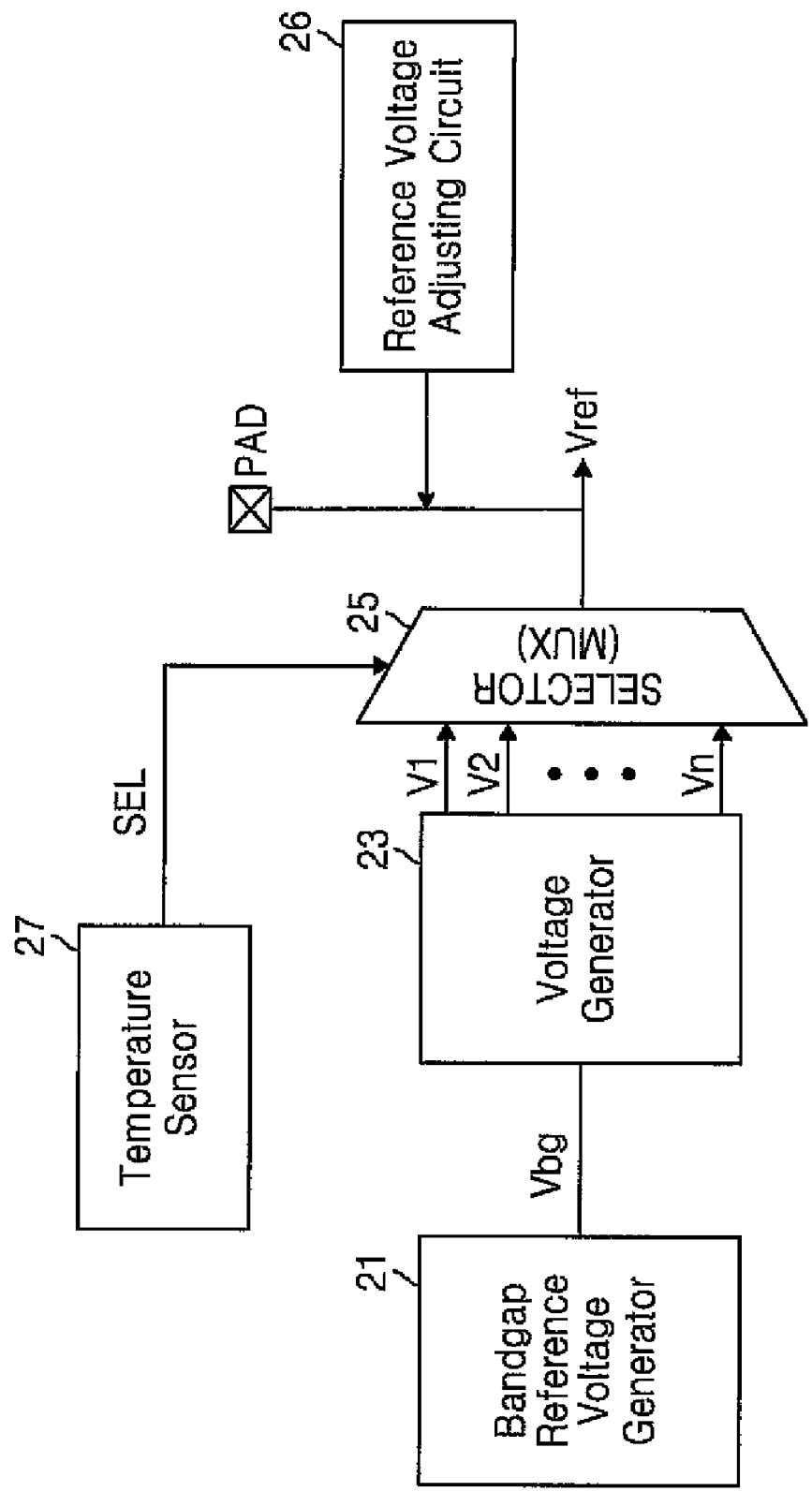

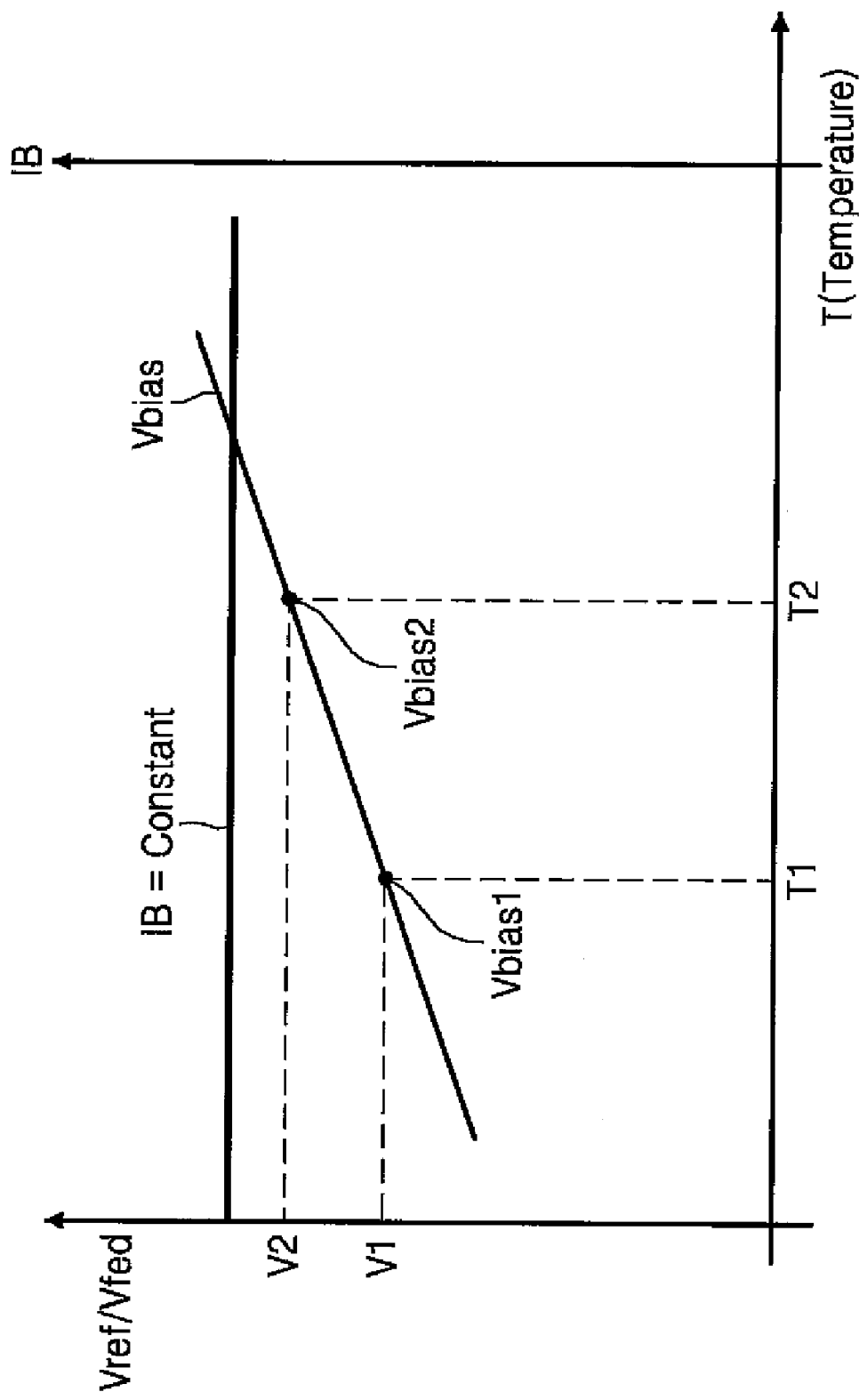

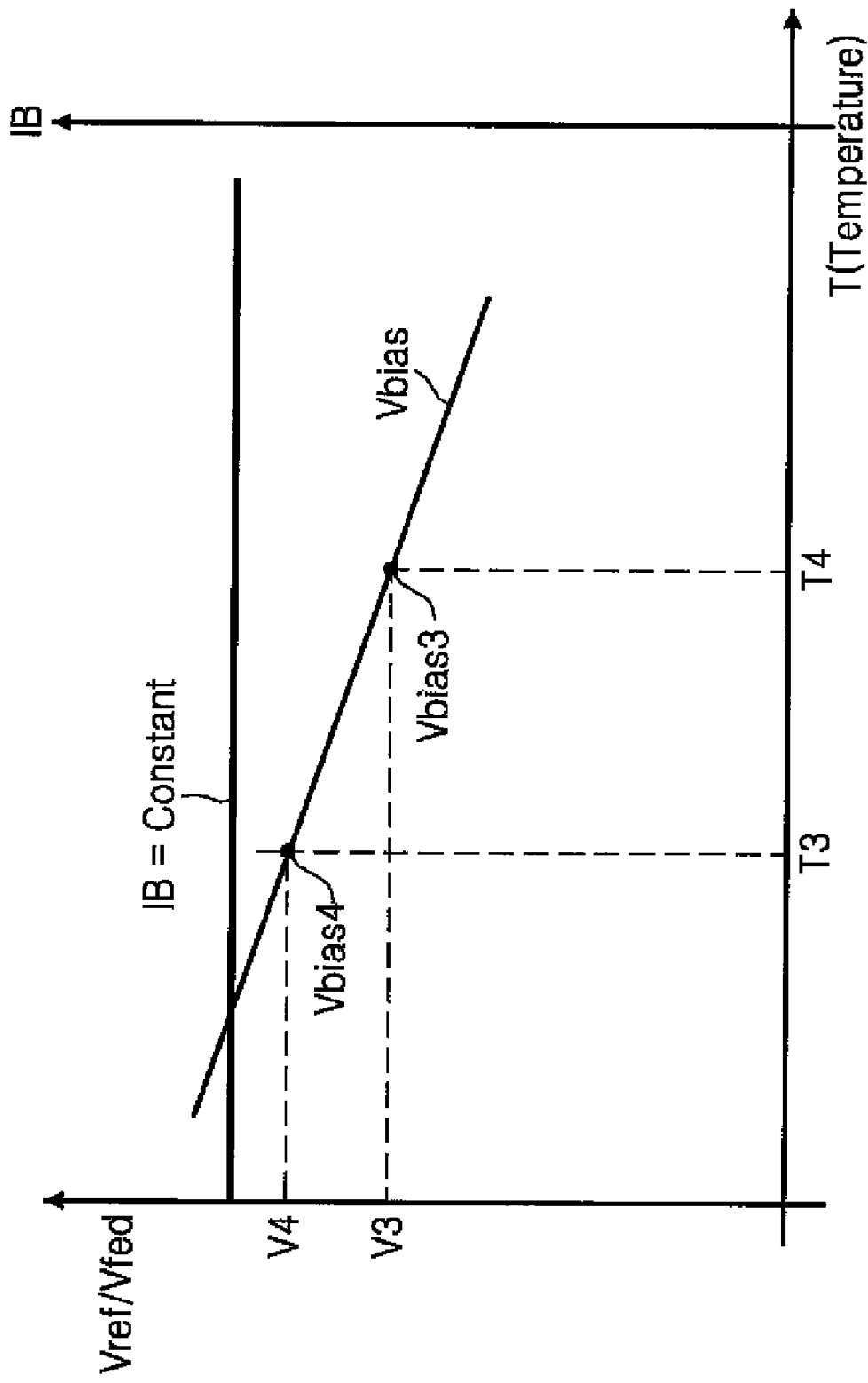

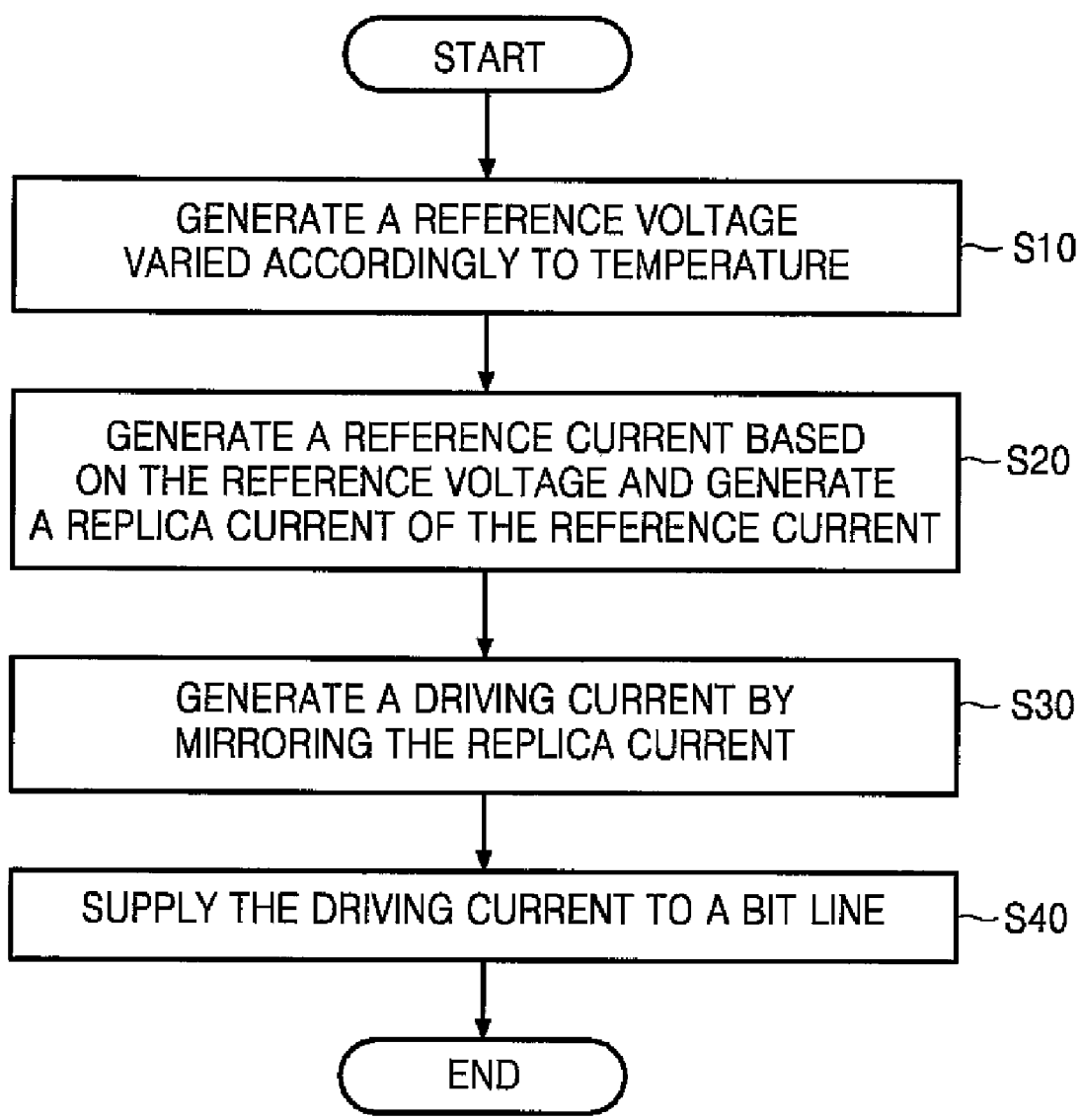

STABLE CURRENT SUPPLY CIRCUIT IRRESPECTIVE OF PVT VARIATIONS AND SEMICONDUCTOR HAVING SAME

CROSS-REFERENCE TO RELATED APPLICATIONS

This application claims priority under 35 U.S.C. §119 to Korean Patent Application No. 10-2009-0051166 filed on Jun. 9, 2009, the subject matter of which is hereby incorporated by reference.

BACKGROUND

Embodiments of the inventive concept relate to semiconductor devices. More particularly, embodiments of the inventive concept relate to current supply circuits configured for use in semiconductor devices and capable of generating a drive current irrespective of variations in pressure (P), voltage (V) and temperature (T) (hereafter, collectively or individually "PVT").

The current generated by conventional current generators varies with PVT. Accordingly, electronic systems processing data may operate differently when supplied with PVT-varying current. Indeed, some circuits and systems are very sensitive to variations in applied supply current. Accordingly, it is necessary to develop a current supply device capable of stably generating a desired current irrespective of PVT variations.

SUMMARY

The general inventive concept provides such a current supply circuit. That is, a current supply circuit, and incorporating semiconductor device, according to various embodiments of the inventive concept have structure(s) and corresponding mode(s) of operation that generate a drive current irrespective of variations in PVT.

An embodiment of the inventive concept is directed to a current supply circuit, including a reference voltage generator for generating a reference voltage varied according to a temperature, a current circuit for generating a constant reference voltage based on the reference voltage, and a current source for generating a mirror current by mirroring a base current generated based on the reference voltage. The base current is a replica current of the reference current.

The reference voltage generator may include a mode register set for adjusting the reference voltage. The reference voltage generator includes a band gap reference voltage generator for generating a band gap reference voltage, a voltage generator for generating a plurality of voltages based on the band gap reference voltage, and a selector for outputting one of the plurality of voltages as the reference voltage in response to a selection signal. The current supply circuit may further include a temperature sensor for generating the selection signal.

The current circuit includes a reference current circuit for generating the reference current in response to a bias voltage and an operational amplifier for generating the bias voltage by amplifying difference between a voltage generated by the reference current and the reference voltage.

The current source includes a first current path circuit for generating the base current based on the reference voltage, a second current path circuit for generating the mirror current by mirroring the base current, and an operational amplifier, by comparing a voltage of a first node of the first current path circuit with a voltage of a second node of the second current path circuit and feedback a comparison voltage to the first current path circuit, for equalizing the voltage of the first node to the voltage of the second node.

According to another embodiment, the current source includes a first current path circuit for generating the base current based on the reference voltage, a second current path circuit for generating the mirror current by mirroring the base current, and an operational amplifier by comparing a voltage of a first node of the first current path circuit with a voltage of a second node of the second current path circuit and feedback a comparison voltage to the second current path circuit, for equalizing the voltage of the first node with the voltage of the second node.

An embodiment of the inventive concept is directed to a semiconductor device, including a non-volatile memory cell and a current supply circuit for supplying an operational current to the non-volatile memory cell through a bit line. The current supply circuit includes a reference voltage generator for generating a reference voltage varied according to temperature variation, a current circuit for generating a constant reference current unrelated to the temperature variation based on the reference voltage, and a current source for generating the operational current by mirroring a base current as a replica current of the reference current.

The non-volatile memory cell may be a memory cell for storing data by using a phase change.

An embodiment of the present inventive concept is directed to a semiconductor system, including a semiconductor device including a non-volatile memory cell and a processor capable of accessing the non-volatile memory cell. The semiconductor device includes a current supply circuit for supplying an operational current to the non-volatile memory cell to access the non-volatile memory cell.

The current supply circuit includes a reference voltage generator for generating a reference voltage varied according to variation of temperature, a current circuit for generating a constant reference current unrelated to the temperature variation based on the reference voltage, and a current source for generating the operational current by mirroring a base current generated based on the reference voltage. The base current is a replica current of the reference current.

The reference voltage generator generates the reference voltage in proportion to the temperature. The current circuit includes a voltage control current source for generating the reference current in response to a bias voltage, a temperature coefficient circuit, which includes an element having positive temperature coefficient and generates a feedback voltage in response to the reference current, and an operational amplifier for generating the bias voltage by amplifying difference between the reference voltage and the feedback voltage.

According to embodiments, the reference voltage generator generates the reference voltage in inverse proportion to the temperature, and the current circuit includes a voltage control current source for generating the reference current in response to a bias voltage, a temperature coefficient circuit, which includes an element having a negative temperature coefficient and generates a feedback voltage in response to the reference current, and an operational amplifier for generating the bias voltage by amplifying difference between the reference voltage and the feedback voltage.

BRIEF DESCRIPTION OF THE DRAWINGS

These and/or other aspects and advantages of the general inventive concept will become more apparent upon consideration of the description of embodiments taken in conjunction with the accompanying drawings of which:

FIG. 2 shows a block diagram of a reference voltage generator of FIG. 1;

FIG. 3B shows a graph of signals in a current supply circuit where a positive temperature coefficient circuit is applied;

FIG. 3C shows a graph of signals in a current supply circuit where a negative temperature coefficient circuit is applied;

FIG. 7 is a flowchart summarizing a data process method for a semiconductor device according to an embodiment of the inventive concept.

DETAILED DESCRIPTION OF THE EMBODIMENTS

Reference will now be made in some additional detail to embodiments of the inventive concept illustrated in the accompanying drawings. It should be noted, however, that the inventive concept may be variously embodied and should not be construed as being limited to only the illustrated embodiments.

Figure 1:
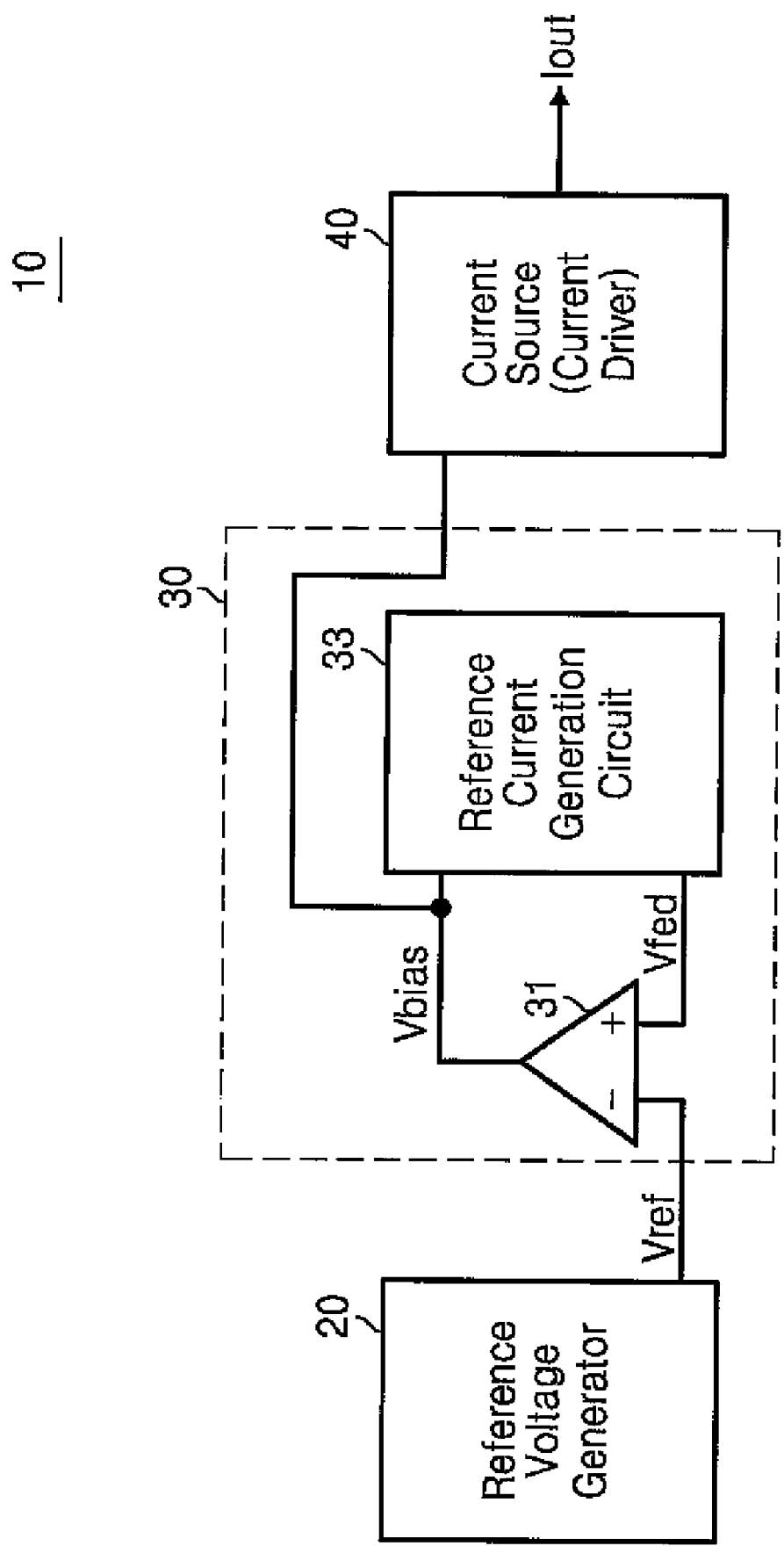
FIG. 1 shows a block diagram of a current supply device according to an embodiment of the inventive concept.

FIG. 1 shows a block diagram of a current supply device according to an embodiment of the inventive concept. Referring to FIG. 1, a current supply device 10 may include a reference voltage generator 20, a current circuit 30 and a current source 40. According to the illustrated embodiment of FIG. 1, the current circuit 30 may respectively drive each one of a plurality of current sources having (an assumed) similar structure.

The reference voltage generator 20 may generate a reference voltage Vref that varies with variations in temperature. However, the current circuit 30 may continually adjust a reference current irrespective of (with insensitively to) the variations in temperature based on the reference voltage Vref provided by the reference voltage generator 20. In one embodiment, the current circuit 30 includes an operational amplifier 31 and a reference current generation circuit 33.

The operational amplifier 31 is configured to generate a bias voltage Vbias in relation to (i.e., in response to) the reference voltage Vref and a feedback voltage Vfed which are applied as inputs to the operational amplifier 31. Thus, the operational amplifier 31 amplifies a difference between the reference voltage Vref and the feedback voltage Vfed to generate the bias voltage Vbias. According to an operational property of the operational amplifier 31, the feedback voltage Vfed increases when the reference voltage Vref increases and the feedback voltage Vfed decreases when the reference voltage Vref decreases. Accordingly, the reference voltage Vref and the feedback voltage Vfed should remain substantially the same.

Thus, the reference current generation circuit 33 may continually adjust the level of the reference current in response to the bias voltage Vbias varied according to variations in the reference voltage Vref, and the feedback voltage Vfed may be generated in accordance with the reference current.

The current source 40 (acting as a current driver) is configured to generate a base current Iout that is same as the reference current based on the reference voltage Vref. Thus, in one embodiment, the current source 40 may operate as a base current mirror generating a corresponding drive current subsequently supplied to (or provided within) a data processing system. Thus, the base current may be a replica current of the reference current.

FIG. 2 shows a block diagram further illustrating the reference voltage generator 20 of FIG. 1. Referring to FIG. 2, the reference voltage generator 20 may include a band gap reference voltage generator 21, a voltage generator 23 and a selector 25.

The band gap reference voltage generator 21 may generate a band gap reference voltage Vbg. The voltage generator 23 may generate a plurality of voltages V1 to Vn having respective different levels based on (or derived from) the band gap reference voltage Vbg. For example, the plurality of voltages may be defined as V1>V2>...>Vn. The voltage generator 23 may be embodied using elements that are relatively insensitive to temperature variations, such as a resistor ladder, diode-connected PMOSFETs, etc. The selector 25 may output one of the plurality of voltages V1 to Vn as the reference voltage Vref in response to a selection signal SEL. The reference voltage generator 27 may further include a temperature sensor 27 capable of sensing a surrounding (or ambient) temperature and outputting the sensing result as the selection signal SEL applied to the selector 25.

FIG. 2 illustrates an embodiment wherein the temperature sensor 27 generates the selection signal SEL. However, a mode register set may be used instead of the temperature sensor 27 in other embodiments. Accordingly, the selection signal SEL may be varied according to set values for the mode register set. The reference voltage generator 20 may generate the reference voltage Vref, which increases with an increase in temperature, or the reference voltage Vref, and which decreases with a decrease in temperature in response to the selection signal SEL.

The reference voltage generator 20 may further include a PAD connected to an output terminal providing the reference voltage Vref. Here, the PAD may be used to monitor the bias voltage Vbias indirectly. That is, the bias voltage Vbias may be derived in accordance with the reference voltage Vref, so that the bias voltage Vbias may be monitored indirectly by monitoring the reference voltage Vref at the PAD. Those skilled in the art will recognize that the PAD may be variously implemented as a conductive structure at which the reference voltage Vref is apparent.

In addition, the reference voltage Vref may be adjusted to a defined level by externally forcing a voltage to the PAD. Therefore, the current supply device 10 of FIG. 1 may further comprises a reference voltage adjusting circuit 26 configured to generate this type of external voltage. The application of the external voltage (or current) to the PAD is just one approach to the regulation of the level of the reference voltage Vref.

Figure 3A:
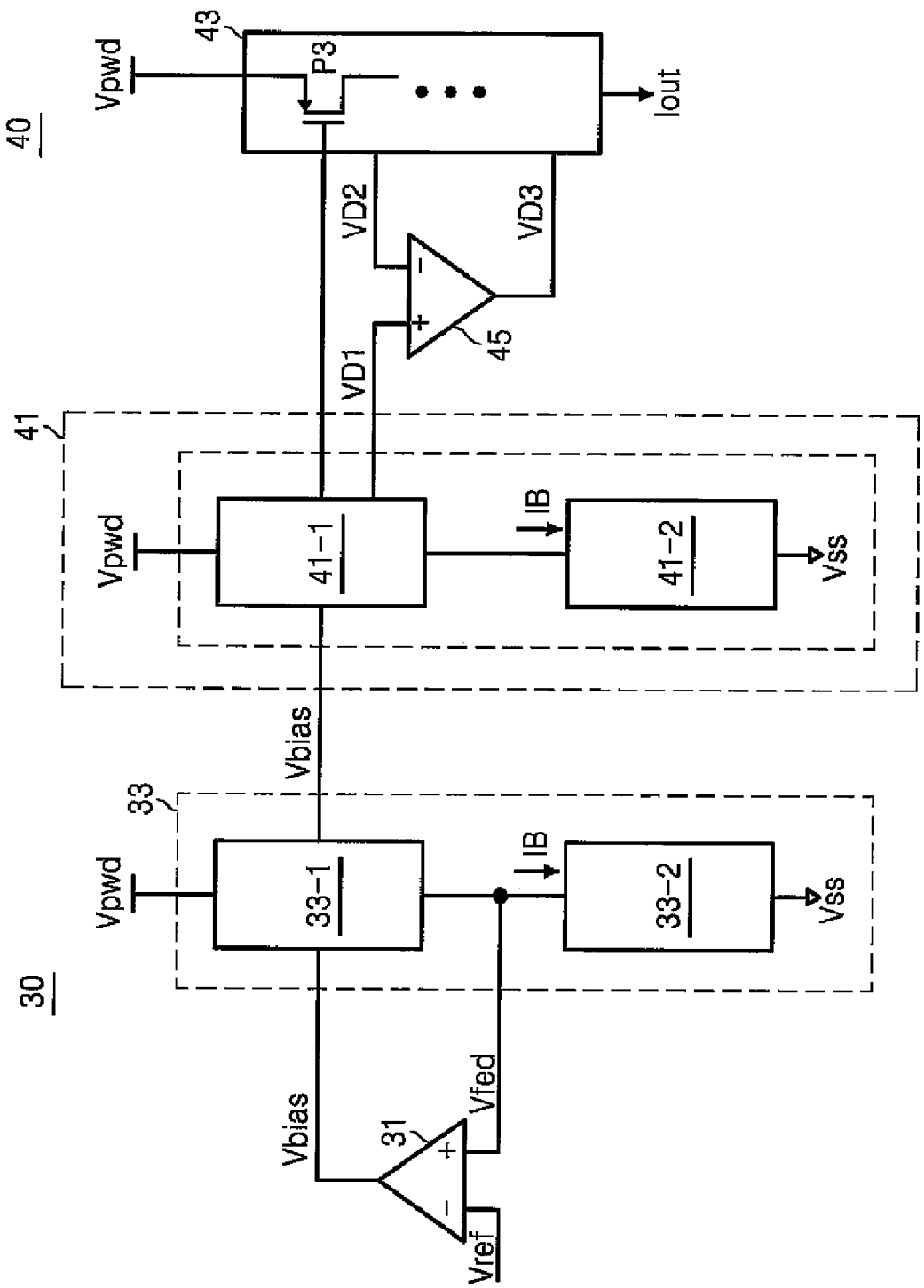
FIG. 3A shows an embodiment of a circuit diagram including a current circuit and a current source illustrated in FIG. 1.
Figure 4:
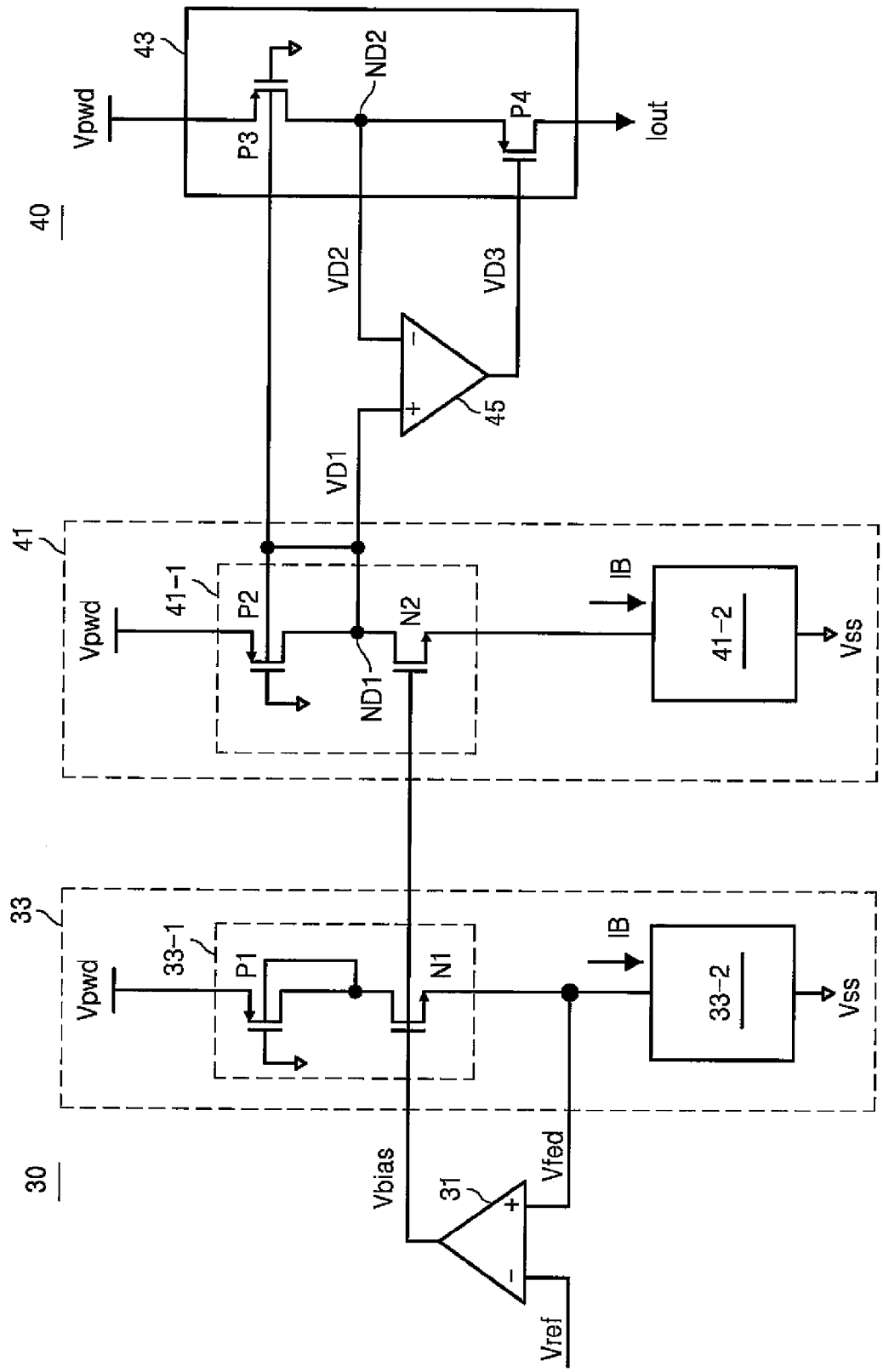
FIG. 4 shows a circuit diagram including a current circuit and a current source illustrated in FIG. 3A.

FIG. 3A is a circuit diagram further illustrating the current circuit 30 and current source 40 of FIG. 1. FIG. 3B is a corresponding graph showing signals provided form the current supply circuit where a positive temperature coefficient circuit is applied, and FIG. 3C is another graph showing the signals provided by the current supply circuit where a negative temperature coefficient circuit is applied. FIG. 4 is a more detailed circuit diagram further illustrating the current circuit 30 and current source 40 of FIG. 3.

As shown in FIG. 1, the current circuit 30 may include the operational amplifier 31 and the reference current generation circuit 33. The operational amplifier 31 may generate the bias voltage Vbias by regulating a reference current IB by amplifying a difference between the reference voltage Vref and feedback voltage Vfed. And the reference current generation circuit 33 may generate a constant reference current IB irrespective of variations in temperature according to a bias voltage Vbias. The reference current generation circuit 33 may include a voltage-controlled current source 33-1 and a temperature coefficient circuit 33-2. The voltage-controlled current source 33-1 may generate a reference current IB controlled in response to the bias voltage Vbias. The temperature coefficient circuit 33-2 may include at least an element whose resistance varies according to temperature.

According to the embodiments illustrated in FIGS. 3 and 4, the temperature coefficient circuit 33-2 may be embodied as a positive temperature coefficient circuit having a property that resistance increases as temperature increases, or a negative temperature coefficient circuit having a property that resistance decreases as temperature decreases.

The current source 40 may include a current mirror and a feedback circuit 45. The current mirror includes a first current path circuit 41 and a second current path circuit 43.

The first current path circuit 41, a replica circuit for the reference current generation circuit 33, may generate the base current IB, a replica current of the reference current IB, in response to the reference voltage Vref. The first current path circuit 41 includes a voltage-controlled current source 41-1 having the same structure as a voltage-controlled current source 33-1 of the reference current generation circuit and a temperature coefficient circuit 41-2 having the same structure as a temperature coefficient circuit 33-2 of the reference current generation circuit 33. By embodying each of the reference current generation circuit 33 and the first current path circuit 41 as a replica circuit of the other, PVT variation may be minimized.

The second current path circuit 43 may generate a mirror current Iout by mirroring a base current IB. The mirror current Iout may be integer times of the base current IB.

To equalize a voltage VD1 of a first node ND1 of the first current path circuit 41 with a voltage VD2 of a second node ND2 of the second current path circuit 43, the operational amplifier 45, used as an example of a feedback circuit, feedbacks a control voltage VD3, which is generated according to a result of comparing the voltage VD1 of the first node ND1 with the voltage VD2 of the second node ND2, to the second current path circuit 43. According to another example embodiment, the operational amplifier 45 may feedback a control voltage VD3 to the first current path circuit 41, e.g., a voltage-controlled current source 41-1, so that voltages VD1 and VD2 input to two input terminals become the same.

Since an output resistance of a current source 40 increases dramatically depending on a structure of a current source 40 according to an embodiment of the inventive concept, the current source 40 may generate a constant mirror current Iout irrespective of (or with insensitively to) variations in a load resistance, (e.g., resistance of a bit line connected to an output terminal).

As output resistance of the current source 40 grows dramatically bigger, a drain-source voltage of an output PMOSFET P3 of the current source 40 operating in a saturation region may be decreased. Accordingly, as a supply voltage Vpwd of the current source 40 may be decreased, the current supply circuit 10 becomes insensitive to noise apparent of the supply voltage Vpwd.

Referring again to FIG. 4, the voltage-controlled current source 33-1 of the current circuit 30 may include a plurality of transistors P1 and N1 connected in series between a node at which the supply voltage Vpwd is apparent and a temperature coefficient circuit 33-2. The gate of the PMOSFET P1 is grounded, and a body and a drain are connected. Moreover, the bias voltage Vbias is supplied to the gate of a NMOS transistor N1.

The voltage-controlled current source 41-1 of the first current path circuit 41 may include a plurality of transistor P2 and N2 connected in series between a node at which the supply voltage Vpwd is apparent and the temperature coefficient circuit 41-2. The gate of a PMOSFET P2 is grounded, and a body and a drain of the PMOSFET P2 are connected.

The second current path circuit 43 includes a plurality of transistor P3 and P4 connected in series between a node at which the supply voltage Vpwd is apparent and an output terminal. The gate of a PMOSFET P3 is grounded, and a body of the PMOSFET P3 is connected to the body of the PMOSFET P2. The output terminal of the operational amplifier 45 is connected to the gate of a PMOSFET P4.

When a reference voltage generator 20 outputs a reference voltage Vref in proportion of temperature and each temperature coefficient circuit 33-2 and 41-2 is embodied as a positive temperature coefficient circuit having a resistance in proportion of the temperature referring to FIGS. 1 to 3B and 4, an operation of the current supply circuit 10 is explained as below.

With reference to FIGS. 3B and 3C, when the reference voltage generator 20 at a first temperature T1 outputs a first voltage V1 as a reference voltage Vref, the operational amplifier 31 outputs a first bias voltage Vbias1 by amplifying the difference between the reference voltage Vref and feedback voltage Vfed.

Accordingly, the voltage-controlled current source 33-1 generates a reference current IB in response to the first bias voltage Vbias1, and the reference current IB flows in a positive temperature coefficient circuit 33-2. The first current path circuit 41 generates a base current IB, which is equal to the reference current IB, in response to the first bias voltage Vbias1. Accordingly, the second current path circuit 43 generates a mirror current Iout where the base current IB is mirrored.

When the reference voltage Vref is constant, a temperature increase of the current supply circuit 10 from the first temperature T1 to a second temperature T2 causes an increase in resistance of each positive temperature coefficient circuit 33-2 and 41-2. It decreases the reference current IB and base current IB. Accordingly, a mirror current Iout where the base current IB is mirrored also decreases. However, the voltage generator 20 according to an embodiment of the inventive concept, when a temperature of the current supply circuit 10 increases from a first temperature T1 to a second temperature T2, outputs a voltage corresponding to an increased temperature, e.g., a second voltage V2 higher than a first voltage V1, as a reference voltage Vref.

As a feedback voltage Vfed increases with a reference voltage Vref according to a property of the operational amplifier 31, a bias voltage Vbias output from the operational amplifier 31 as illustrated in FIG. 3B increases from a first bias voltage Vbias1 to a second bias voltage Vbias2.

Accordingly, as a temperature of the current supply circuit 10 increases from a first temperature T1 to a second temperature T2, a reference voltage Vref increases from a first voltage V1 to a second voltage V2 even though a resistance of each positive temperature coefficient circuit 33-2 and 41-2 increases. Accordingly, a bias voltage Vbias increases from a first bias voltage Vbias1 to a second bias voltage Vbias2 and the reference current circuit 33 may continually regulate (or adjust) the reference current IB irrespective of an increase in temperature in response to the second bias voltage Vbias2.

Since the first current path circuit 41 may generate a base current IB, which is equal to a reference current IB, in response to the second bias voltage Vbias2, the second current path circuit 43 may generate a mirror current 1out by mirroring the base current IB. Accordingly, the current supply circuit 10 may generate a constant reference current IB and a constant mirror current 1out irrespective of variations in temperature.

Additionally, when the reference voltage generator 20 outputs a reference voltage Vref in inverse proportion to temperature and each temperature coefficient circuit 33-2 and 41-2 is embodied as a negative temperature coefficient circuit having a resistance inversely proportion to the temperature, referring to FIGS. 1-3A, FIG. 3C, and FIG. 4, an operation of the current supply circuit 10 is explained as follows.

When the reference voltage generator 20 outputs a fourth voltage V4 as a reference voltage Vref at a third temperature T3, the operational amplifier 31 outputs a fourth bias voltage Vbias4 after amplifying difference between the reference voltage Vref and the feedback voltage Vfed. Accordingly, a voltage-controlled current source 33-1 generates a reference current IB in response to the fourth bias voltage Vbias4 and the reference current IB flows in a negative temperature coefficient circuit 33-2.

The first current path circuit 41 generates a base current IB the same as the reference current IB in response to the fourth bias voltage Vbias4. The second current path circuit 43 generates a mirror current 1out where the base current is mirrored, accordingly.

When the reference voltage Vref is constant, a temperature increase of the current supply circuit 10 from a third temperature T3 to a fourth temperature T4 causes a resistance decrease of each negative temperature coefficient circuit 33-2 and 41-2 and an increase of the reference current IB and the base current IB. Accordingly, the mirror current 1out where the base current IB is mirrored also increases. However, a voltage generator 20 according to an embodiment of the inventive concept, when a temperature of the current supply circuit 10 increases from a third temperature T3 to a fourth temperature T4, outputs a voltage corresponding to an increased temperature, e.g., a third voltage V3 lower than a fourth voltage V4, as a reference voltage Vref.

Since a feedback voltage Vfed decreases with a reference voltage Vref according to a property of the operational amplifier 31, a bias voltage Vbias output from the operational amplifier 31 decreases from a fourth bias voltage Vbias4 to a third bias voltage Vbias3 as illustrated in FIG. 3C. Accordingly, as a temperature of the current supply circuit 10 increases from a third temperature T3 to a fourth temperature T4, a reference voltage Vref decreases from a fourth voltage V4 to a third voltage V3 even through a resistance of each negative temperature coefficient circuit 33-2 and 41-2 decreases. Accordingly, a bias voltage Vbias decreases from a fourth bias voltage Vbias4 to a third bias voltage Vbias3 and a bias circuit 33 may regulate (or adjust) a reference current IB constantly in response to the third bias voltage Vbias3.

In addition, since the first current path circuit 41 may generate a base current IB, which is equal to the reference current IB, in response to the third bias voltage Vbias3, the second current path circuit 43 may generate a mirror current 1out by mirroring the base current IB. Accordingly, the current supply circuit 10 may generate a constant reference current IB and a constant mirror current 1out irrespective of variations in temperature.

Figure 5:
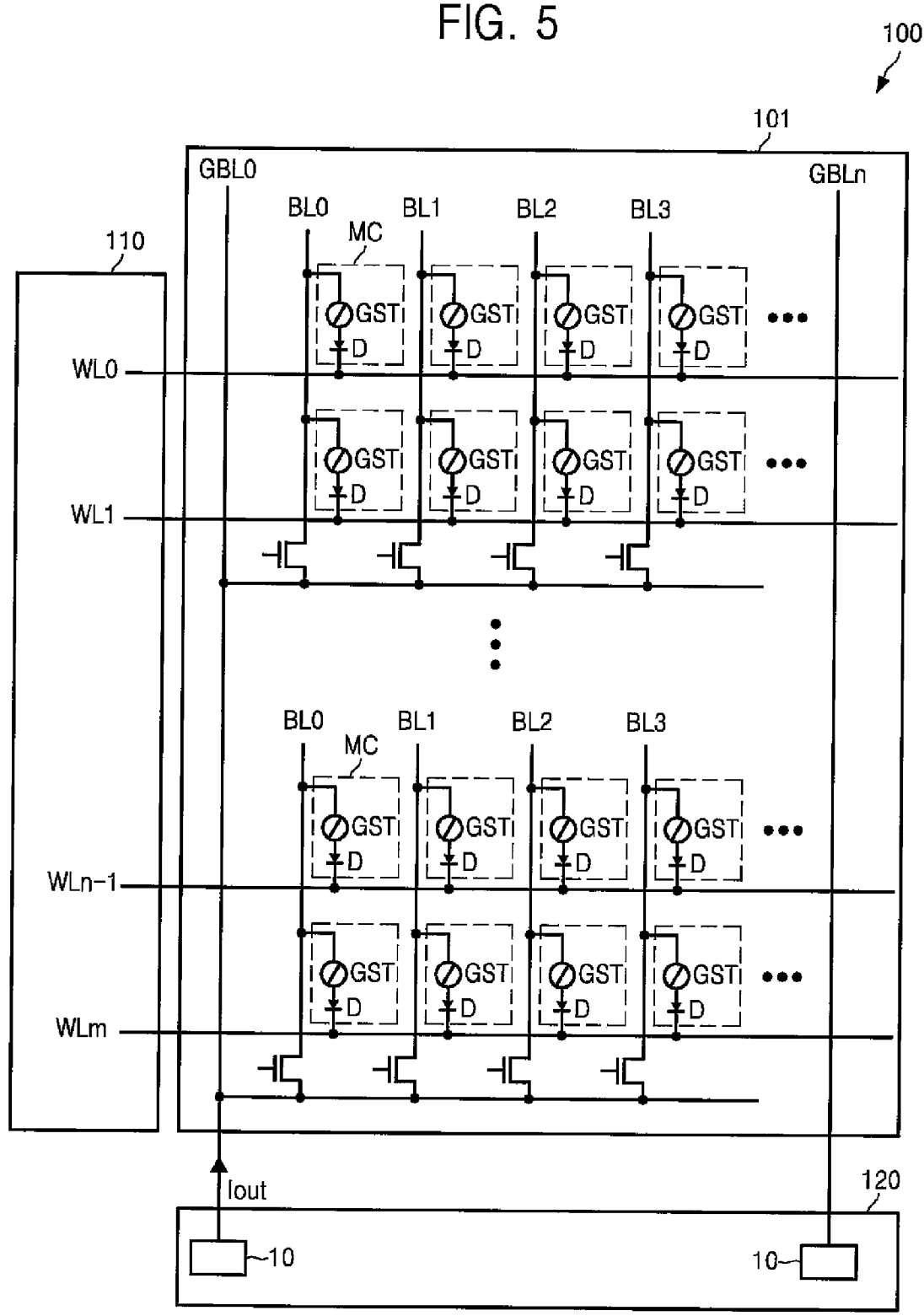
FIG. 5 shows a block diagram of a semiconductor device including a current supply device according to an embodiment of the inventive concept.

FIG. 5 is a block diagram of a semiconductor device 100 incorporating the current supply device 10 according to an embodiment of the inventive concept. Referring to FIG. 5, the semiconductor device 100 comprises a memory array 101, a row decoder 110 and a write driver circuit 120.

The memory array 101 includes a plurality of word lines WL0 to WLm, a plurality of bit lines (GBL0 to GBLn, BL0 to BL3) and a plurality of memory cells MC. Each global bit line GBL0 to GBLn among a plurality of bit lines (GBL0 to GBLn, BL0, BL1, BL2, BL3 . . . ) is connected to a corresponding current supply circuit 10, and each bit line (BL0, BL1, BL2, BL3 . . . ) is connected to a global bit line GBL0 to GBLn through a switch. Here, a plurality of switches may functionally operate as a column decoder.

The write driver circuit 120 may include a plurality of current supply circuits 10 respectively connected to the plurality of global bit lines GBL0 to GBLn.

A plurality of memory cells MC may include PRAM cells (MC), respectively, and the PRAM cell MC may be implemented, as is conventionally understood, by one or more phase change material(s), such as chalcogenide alloy, Ge2Sb2Te5(GST), and a diode. Moreover, the plurality of memory cells MC may include an Electrically Erasable Programmable Read-Only Memory (EEPROM), a flash memory, a Magnetic RAM (MRAM), a spin-transfer torque MRAM, a conductive bridging RAM (CBRAM), a Ferro-electric RAM (FeRAM), a Phase change RAM (PRAM) also called an Ovonic unified memory (OUM), a resistive RAM (RRAM or ReRAM), a Nanotube RRAM, a polymer RAM (PoRAM), a Nano Floating Gate Memory (NFGM), a holographic memory, a molecular electronics memory device or an insulator resistance change memory, respectively. The non-volatile memory cell may store a bit or a plurality of bits.

The row decoder 110 selects a corresponding word line among a plurality of word lines WL0 to WLm in response to a low address and each switch connects each bit line to each global bit line in response to a corresponding selection signal among a plurality of selection signals. The write driver circuit 120 outputs a write drive current 1out for writing a write data in a memory array during a writing operation. As described above in relation to FIGS. 1 to 4, a drive current 1out has a constant value irrespective of (or in sensitive to) temperature variations.

Figure 6:
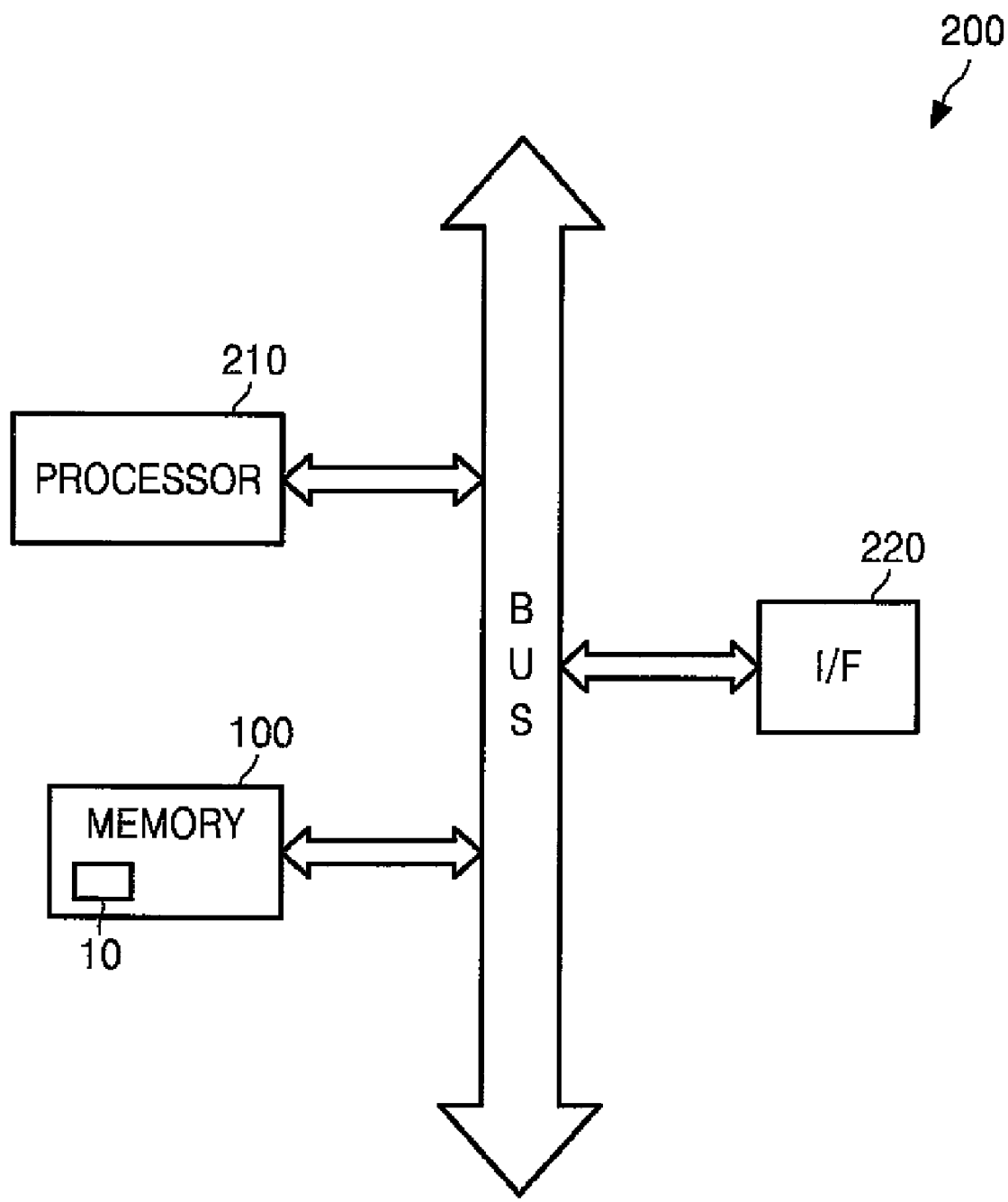
FIG. 6 shows a block diagram of a semiconductor system including the semiconductor device illustrated in FIG. 5.

FIG. 6 shows a block diagram of a semiconductor system including a semiconductor device according to an embodiment of the inventive concept. Referring to FIG. 6, a semiconductor system 200 may include a semiconductor device 100, a processor 210 and an interface 220. The semiconductor device 100 may perform a write operation, a read operation or an erase operation under a control of the processor 210.

The processor 210 may transmit control signals, required to write data in the semiconductor device 100, and the data to the semiconductor device 100. The processor 210 may also transmit control signals, required to read data from the semiconductor device 100, to the semiconductor device 100. The processor 210 may transmit data read from the semiconductor device 100 to outside through the interface 220 and write a write data input through the interface 220 in the semiconductor device 100. The interface 220 may mean a hardware interface or a software interface. It may be an input/output device or a wireless interface for transmitting and receiving data by radio.

The semiconductor system 200 may further include an image sensor for picking up an image. The image sensor may pick up an image under a control of a processor 210, process a picked-up image and write a processed image in the semiconductor device 100. The semiconductor system 200 may include a computer system, a mobile communication device such as a mobile phone and a PDA, a memory card, a smart card, an e-book and a system like a PMP.

FIG. 7 is a flowchart summarizing a write method for a semiconductor device according to an embodiment of the inventive concept. Referring to FIGS. 1 to 7, a reference voltage generator 20 generates a reference voltage Vref, which is varied according to temperature (S10). A current circuit 30 generates a constant reference current IB regardless of variation of temperature based on the reference voltage Vref, which is varied according to the temperature variation, and a current source 40 generates a base current IB, which is a replica current of the reference current IB (S20).

The current source 40 generates a drive current 1out, which is a mirror current, by mirroring the base current IB (S30). The current source 40 supplies the drive current 1out, irrelevant or insensitive to variation of temperature, to a bit line (S40). As described above, since the current supply circuit 10 may generate the drive current 1out unrelated to PVT variation, reliability of a semiconductor device, which writes data by using the drive current 1out, gets increased.

A current supply circuit according to an embodiment of the inventive concept may generate a drive current irrespective of PVT variations. Accordingly, a semiconductor device including the current supply circuit may write data insensitively to the PVT variation.

Although a few embodiments of the general inventive concept have been shown and described, it will be appreciated by those skilled in the art that changes may be made in these embodiments without departing from the principles of the general inventive concept, the scope of which is defined in the appended claims and their equivalents.

What is claimed is:

1. A current supply circuit comprising:
   a reference voltage generator configured to generate a reference voltage;
   a current circuit configured to generate a constant reference current based on the reference voltage; and
   a current source configured to generate a mirror current by mirroring a base current generated as a replica current of the reference current; wherein the current supply circuit is configured to supply operating current to a non-volatile memory cell via a bit line.

2. The current supply circuit of claim 1, wherein the reference voltage generator generates the reference voltage in proportion to variations in temperature, and the current circuit continually regulates the reference current in response to the reference voltage.

3. The current supply circuit of claim 1, wherein the reference voltage generator generates the reference voltage in inverse proportion to variations in temperature, and the current circuit continually regulates the reference current in response to the reference voltage.

4. The current supply circuit of claim 1, wherein the reference voltage generator comprises a mode register set configured to adjust the reference voltage.

5. The current supply circuit of claim 1, wherein the reference voltage generator comprises:
   a band gap reference voltage generator configured to generate a band gap reference voltage;
   a voltage generator configured to generate a plurality of voltages based on the band gap reference voltage; and
   a selector configured to provide one of the plurality of voltages as the reference voltage in response to a selection signal.

6. The current supply circuit of claim 5, further comprising a temperature sensor configured to generate the selection signal in relation to a detected temperature.

7. The current supply circuit of claim 1, wherein the current circuit comprises:
   a reference current generation circuit configured to generate the reference current in response to a bias voltage; and
   an operational amplifier configured to generate the bias voltage by amplifying a difference between a voltage generated by the reference current and the reference voltage.

8. The current supply circuit of claim 1, wherein the current source comprises:
   a first current path circuit configured to generate the base current based on the reference voltage;
   a second current path circuit configured to generate the mirror current by mirroring the base current; and
   an operational amplifier configured to compare a voltage apparent at a first node of the first current path circuit with a voltage apparent at a second node of the second current path circuit and generate a comparison voltage, feedback the comparison voltage to the first current path circuit, and equalize the voltage apparent at the first node to the voltage apparent at the second node.

9. The current supply circuit of claim 1, further comprising a reference voltage adjusting circuit configured to supply an external voltage to an output terminal of the reference voltage generator to adjust the reference voltage.

10. A semiconductor device comprising:
    a non-volatile memory cell; and
    a current supply circuit configured to supply operating current to the non-volatile memory cell via a bit line, wherein the current supply circuit comprises:
       a reference voltage generator configured to generate a reference voltage that varies in accordance with variations in temperature;
       a current circuit configured to generate a constant reference current irrespective of the variations in temperature and in response to the reference voltage; and
       a current source configured to generate the operating current by mirroring a base current as a replica current of the reference current.

11. The semiconductor device of claim 10, wherein the non-volatile memory cell stores data in accordance with a material state of a phase changeable material.

12. The semiconductor device of claim 10, wherein the reference voltage generator is configured to generate the reference voltage in proportion to the temperature and the current circuit continually regulates the reference current based on the reference voltage.

13. The semiconductor device of claim 10, wherein the reference voltage generator is configured to generate the reference voltage in inverse proportion to the temperature and the current circuit continually the reference current based on the reference voltage.

14. The semiconductor device of claim 10, wherein the current circuit comprises:
    a reference current circuit configured to generate the reference current in response to a bias voltage; and
    an operational amplifier configured to generate the bias voltage by amplifying a difference between a voltage generated by the reference current and the reference voltage.

15. The semiconductor device of claim 11, wherein the current source comprises:
    a first current path circuit configured to generate the base current based on the reference voltage;
    a second current path circuit configured to generate the operating current by mirroring the base current; and
    an operational amplifier configured to compare a voltage apparent at a first node of the first current path circuit with a voltage apparent at a second node of the second current path circuit to generate a comparison voltage, feedback the comparison voltage to the first current path circuit, and equalize the voltage apparent at the first node to the voltage apparent at the second node.

16. A semiconductor system comprising:
a semiconductor device including a non-volatile memory cell; and
a processor capable of accessing data stored in the non-volatile memory cell,
wherein the semiconductor device comprises a current supply circuit configured to supply an operating current to the non-volatile memory cell via a bit line during access to the data stored in the non-volatile memory cell,
wherein the current supply circuit comprises:
   a reference voltage generator configured to generate a reference voltage that varies in accordance with variations in temperature;
   a current circuit configured to generate a constant reference current irrespective of the variations in temperature and in response to the reference voltage; and
   a current source configured to generate the operating current by mirroring a base current as a replica current of the reference current.

17. The semiconductor system of claim 16, wherein the reference voltage generator generates the reference voltage in proportion to the temperature, and
the current circuit comprises:
   a voltage control current source configured to generate the reference current in response to a bias voltage;
   a temperature coefficient circuit having an element with a positive temperature coefficient and configured to generate a feedback voltage in response to the reference current; and
   an operational amplifier configured to generate the bias voltage by amplifying a difference between the reference voltage and feedback voltage.

18. The semiconductor system of claim 16, wherein the reference voltage generator generates the reference voltage in proportion to the temperature, and
the current circuit comprises:
   a voltage control current source configured to generate the reference current in response to a bias voltage;
   a temperature coefficient circuit having an element with a negative temperature coefficient and configured to generate a feedback voltage in response to the reference current; and
   an operational amplifier configured to generate the bias voltage by amplifying a difference between the reference voltage and feedback voltage.

* * * * *